United States Patent [19]

Honjo et al.

[11] Patent Number: 4,812,783

[45] Date of Patent: Mar. 14, 1989

[54] PHASE LOCKED LOOP CIRCUIT WITH QUICKLY RECOVERABLE STABILITY

[75] Inventors: Masahiro Honjo, Neyagawa; Akihiro Takeuchi, Ikoma; Atsuo Ochi, Kadoma; Shinichi Aki, Osaka; Yukio Nakagawa, Moriguchi; Masaaki Kobayashi, Kawanishi, all of Japan

[73] Assignee: Matsushita Electric Industrial Co., Ltd., Osaka, Japan

[21] Appl. No.: 88,218

[22] Filed: Aug. 24, 1987

[30] Foreign Application Priority Data

Aug. 26, 1986 [JP] Japan ................... 61-199640
Sep. 22, 1986 [JP] Japan ................... 61-224457
Sep. 22, 1986 [JP] Japan ................... 61-224458

[51] Int. Cl.$^4$ .................................... H04N 5/06
[52] U.S. Cl. ........................... 331/20; 331/1 A; 331/25; 358/158
[58] Field of Search ............... 331/1 A, 17, 20, 21, 331/25; 358/146, 158

[56] References Cited

U.S. PATENT DOCUMENTS 4,689,582  8/1987  Balaban et al. ................. 331/25 X Primary Examiner—Eugene R. LaRoche
Assistant Examiner—Robert J. Pascal
Attorney, Agent, or Firm—Wenderoth, Lind & Ponack

[57] ABSTRACT

A PLL circuit for a phase comparator, a low-pass filter (LPF), a voltage-controlled oscillator (VCO) and a frequency divider. A first control circuit is responsive to a discontinuous phase change of a reference signal of the PLL circuit for inhibiting the operation of the phase comparator or disconnecting the LPF from the phase comparator during a predetermined period so that the discontinuous phase change information is not transmitted through the LPF to the VCO. At the same time, a second control circuit resets the frequency divider by a pulse of the reference signal after the discontinuous phase change or applies a voltage corresponding to the discontinuous phase change to the VCO so that the output signal of the frequency divider is locked in phase to the reference signal after the discontinuous phase change. With the cooperation of the first and second control circuits, the PLL circuit quickly recovers its stable state after the discontinuous phase change of the reference signal.

3 Claims, 8 Drawing Sheets

PHASE LOCKED LOOP CIRCUIT WITH QUICKLY RECOVERABLE STABILITY

BACKGROUND OF THE INVENTION

1. Field of the Invention

This invention relates to a phase locked loop (PLL) circuit, and more particularly to a PLL circuit applied with an input signal which would often cause discontinuous changes in phase.

2. Description of the Prior Art

A digital signal processing circuit such as a timebase collector (TBC) in a video tape recorder (VTR) uses a memory for temporarily storing a digital video signal as shown in FIG. 1. Referring to FIG. 1, a digital video signal is written into a memory 51 in response to a write clock and the stored digital video signal is read out from the memory 51 in response to a read clock. The address of the memory 51 is reset periodically, for example at intervals of horizontal scanning period (H), by a reset signal. Used as the reset signal is a reference signal d which is a periodic pulse train as shown in FIG. 2 produced from the horizontal synchronizing signal or the burst signal of the video signal reproduced via a pair of rotary heads from a recording tape. The write clock is generated from the reference signal by a PLL circuit 50 comprising a phase comparator 2, a low-pass filter (LPF) 3, a voltage controlled oscillator (VCO) 4 and a frequency divider 5. The PLL circuit 50 operates so that the phase of the output signal e of the frequency divider 5 is locked to the phase of the reference signal d. The response speed of the PLL circuit 50 which is determined by the time constant of the LPF 3 cannot be made too short so that the PLL circuit 50 does not respond to a noise.

The PLL circuit 50 arranged as above cannot immediately recover the stable state when the reference signal d causes a discontinuous change in phase. Since the video signal recorded on the recorded tape is reproduced via a pair of alternately switched heads, there would be caused a discontinuity of the reproduced signal, resulting in a sudden change of the phase of the reference signal. Referring to FIG. 2, HSW is the head switching signal for periodically changing over the pair of heads, and the reference signal causes a discontinuous phase change between pulses $d_1$ and $d_2$. The phase comparator 2 generates an error signal g corresponding to the phase difference between the reference signal d and the output signal e of the frequency divider 5. The frequency divider 5 resets itself by the reset signal f synchronized with the signal e. Due to the time constant of the LPF 3, the error signal g is converted by the LPF 3 to a gradually changing voltage signal h. Therefore, it takes a fairly long time (about 10H in the case of FIG. 2) for the PLL circuit 50 to recover the stable state in which the phase of the output signal of the frequency divider 5 is locked to the phase of the reference signal after the discontinuous phase change.

SUMMARY OF THE INVENTION

Therefore, an object of the present invention is to provide a PLL circuit which is capable of recovering stability when an input signal of the PLL circuit causes a discontinuous change in phase.

A PLL circuit according to the present invention comprises: a voltage-controlled oscillator; a frequency divider for dividing an oscillation frequency of the voltage-controlled oscillator; a phase comparator for comparing phases of an input reference signal and an output signal of the frequency divider; a low-pass filter for converting a phase comparison result of the phase comparator to a voltage signal for controlling the voltage-controlled oscillator; first control means responsive to a discontinuous phase change of the reference signal for preventing a phase change of the reference signal from being transmitted through the low-pass filter to the voltage-controlled oscillator during a predetermined period; and second control means responsive to the discontinuous phase change of the reference signal for forcedly pulling-in the phase of the PLL circuit so that the phase of the output signal of the frequency divider is locked to a phase of the reference signal after the discontinuous phase change during a predetermined period.

In a first preferred embodiment, the first control means inhibits the phase comparison operation of the phase comparator, and the second control means resets the frequency divider by a pulse of the reference signal after the discontinuous phase change.

In a second preferred embodiment, the first control means disconnects the low-pass filter from the phase comparator, and the second control means generates a voltage signal corresponding to the discontinuous phase change of the reference signal and applies this voltage signal to the voltage-controlled oscillator for changing the oscillation frequency so that the phase of the output signal of the frequency divider becomes closer or equal to the phase of the reference signal after the discontinuous phase change.

Since the discontinuous phase change of the reference signal is not transmitted through the low-pass filter to the voltage-controlled oscillator, no long time unstable state due to the time constant of the low-pass filter is caused. At the same time, the PLL circuit is forcedly locked to the new phase of the reference signal after the discontinuous phase change during a short period. Thus, the PLL circuit can recover its stable state quickly after the discontinuous phase change of the reference signal.

The above and other objects, features and advantages of the present invention will be apparent from the following detailed description taken in connection with the accompanying drawings in which:

DESCRIPTION OF THE PREFERRED EMBODIMENTS

Figure 1:
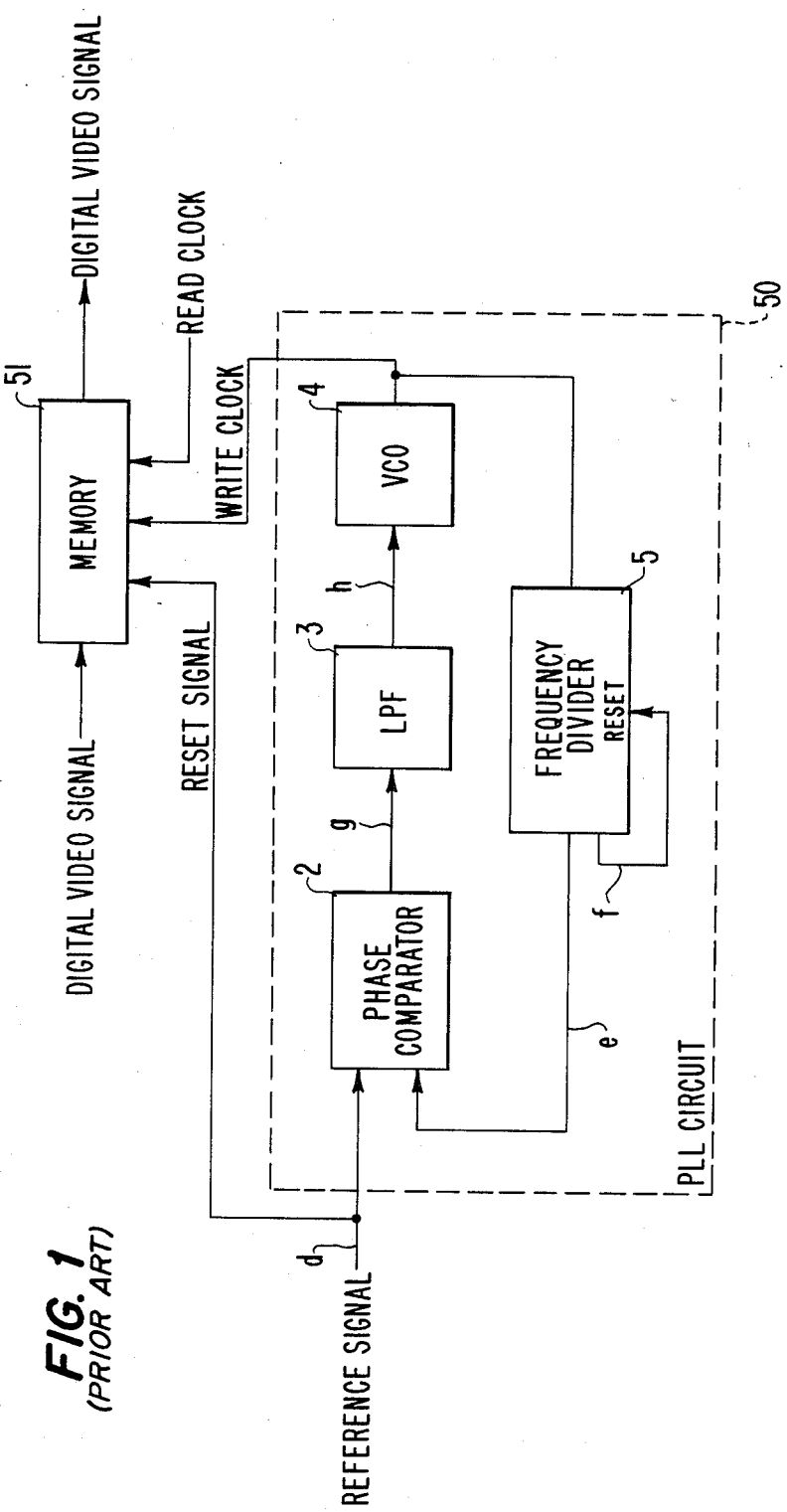
FIG. 1 is a block diagram showing a conventional PLL circuit used for controlling a memory in a VTR.
Figure 2:
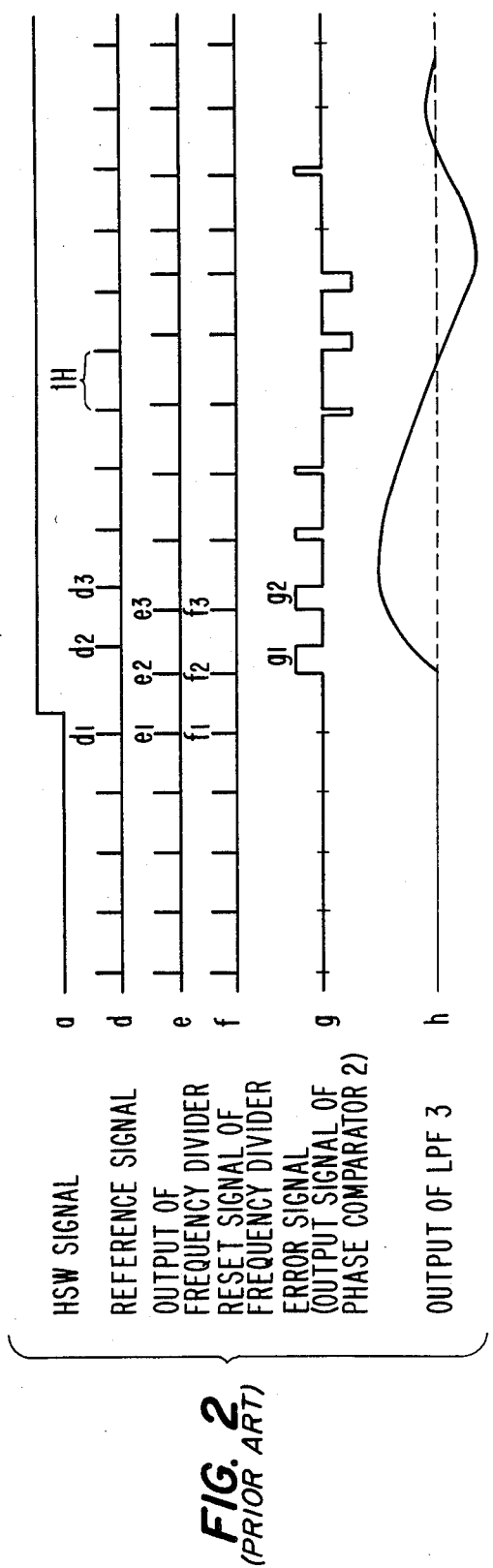
FIG. 2 is a signal waveform chart for explaining the operation of the PLL circuit in FIG. 1.
Figure 3:
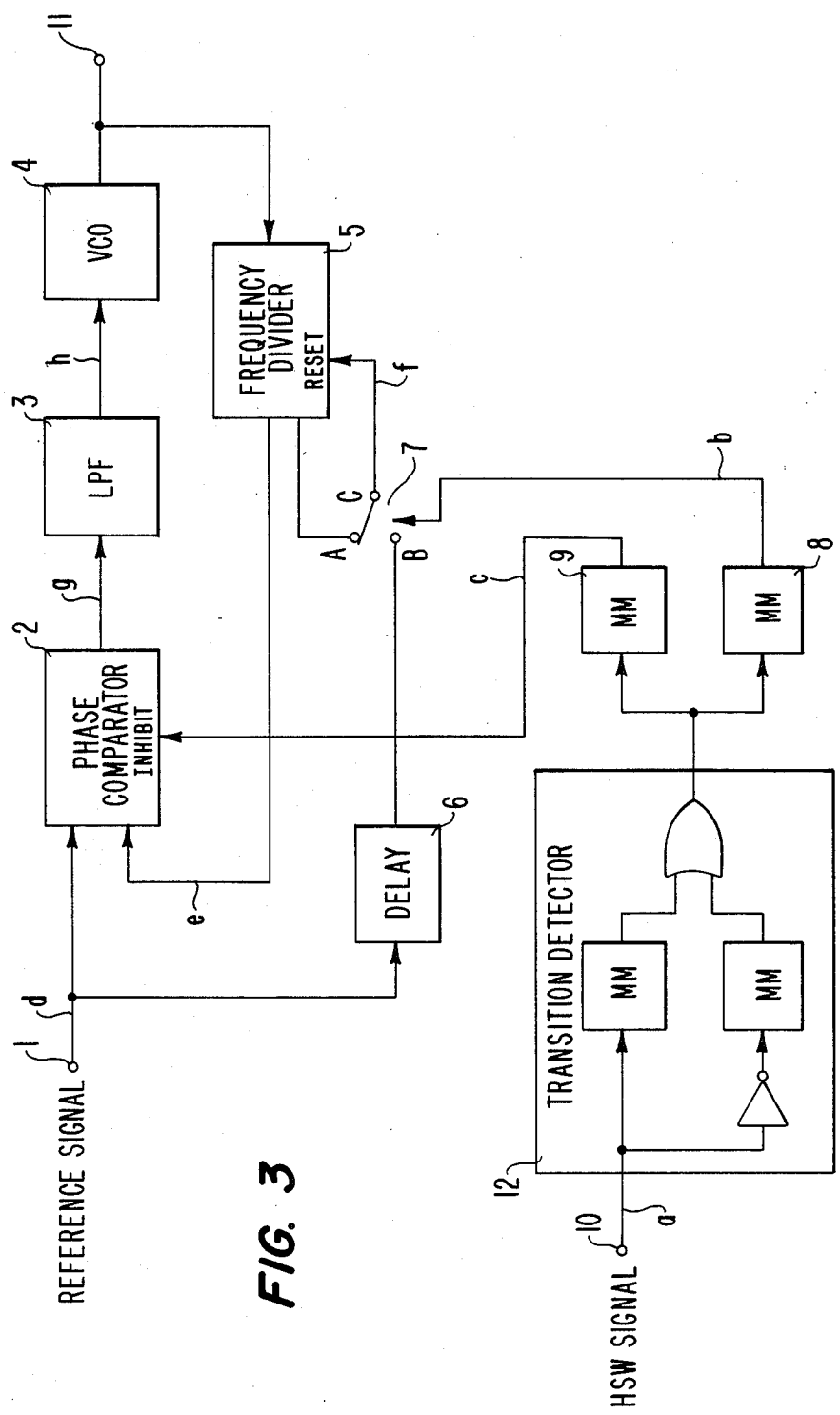
FIG. 3 is a block diagram showing a PLL circuit as an embodiment of the present invention.
Figure 4:
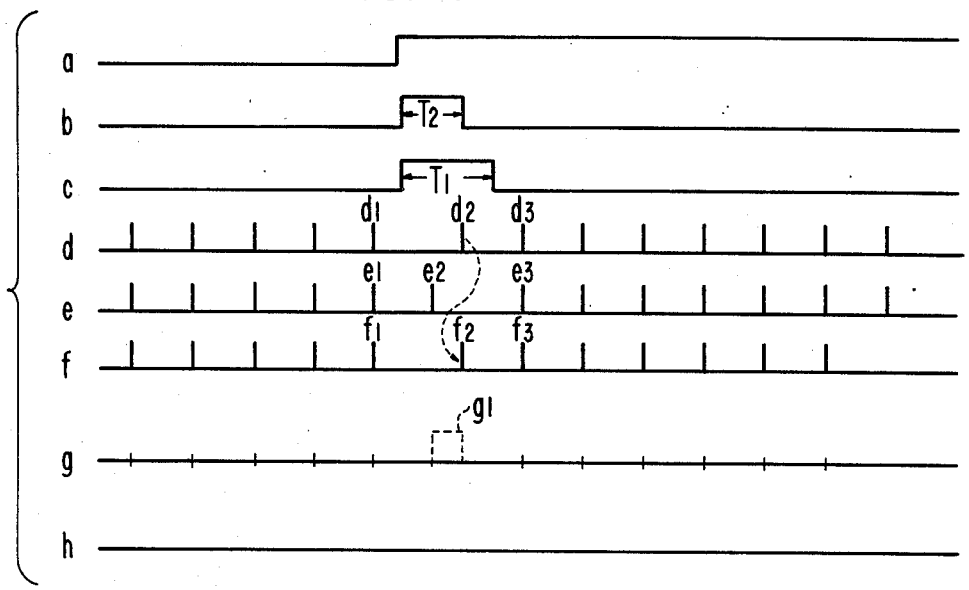
FIG. 4 and FIG. 5 are signal waveform charts for explaining the operation of the PLL circuit in FIG. 3.
Figure 5:
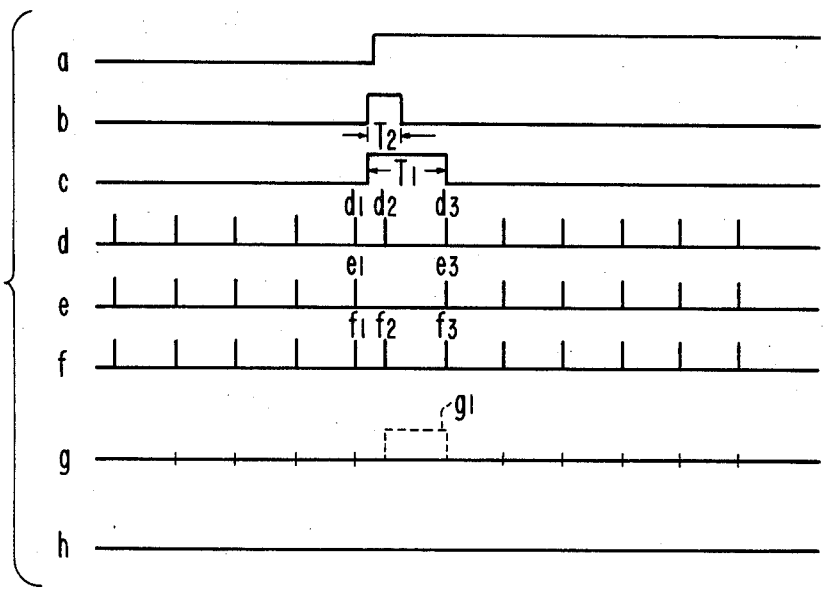

FIG. 3 shows an embodiment of PLL circuit according to the present invention used in a VTR, and FIGS. 4 and 5 show signal waveform charts for explaining the operation of the PLL circuit in FIG. 3. A reference signal inputted to the PLL circuit through an input terminal 1 is a periodic pulse train having a period of H (horizontal scanning period) produced from the horizontal synchronizing signal or the burst signal of a video signal reproduced from a recording tape via a pair of rotary heads. A voltage controlled oscillator (VCO) 4 generates a predetermined high frequency signal which is higher in frequency than and equal in phase to the reference signal when an output signal h of a low-pass filter (LPF) 3 inputted to the VCO 4 is kept constant in level. This high frequency signal is outputted through an output terminal 11 as an output signal of the PLL circuit. The high frequency signal from the VCO 4 is on the other hand divided in frequency by a frequency divider 5 to be equal in frequency to the reference signal as shown as an output signal e of the frequency divider 5. The frequency divider 5 generates also a reset signal which is synchronized with the output signal e for resetting itself. A phase comparator 2 compares the phases of the reference signal d and the output signal e of the frequency divider 5. An output signal g of the phase comparator 2 applied to the LPF 3 is 0 when the phases of the reference signal d and the output signal e of the frequency divider 5 are equal to each other, i.e., when the PLL circuit is in the phase-locked state.

As is well-known, the pair of rotary heads are periodically alternately selected by a head switching signal (HSW signal). Since a discontinuity of the reproduced video signal and the resultant discontinuous phase change of the reference signal d would occur at each switching timing of the pair of rotary head, the HSW signal can be regarded as a discontinuous phase change informing signal for informing an occurrence of discontinuous phase change of the reference signal d. The HSW signal referred to by the symbol a is inputted to the PLL circuit through an additional input terminal 10. A transition detector 12 produces a pulse in response to each transition of the level (from LOW to HIGH or from HIGH to LOW) of the HSW signal a.

A monostable multivibrator (MM) 8 produces a pulse b having a duration T1 in response to the output pulse of the transition detector 12. The pulse b is applied to a switch 7. The switch 7 normally connects its common terminal C to its first terminal A so that the reset signal from the frequency divider 7 becomes a reset signal f applied to a RESET terminal of the frequency divider 5. A second terminal B of the switch 7 is connected through a delay circuit 6 to the input terminal 1. The switch 7, when the pulse b is applied thereto, connects the common terminal C to the second terminal B so that the reference signal adjusted in timing by the delay circuit 6 becomes the reset signal f during the duration T1 of the pulse B. Here, the delay circuit 6 is not always necessary, but may be removed if it is not necessary to adjust the timing of the reference signal applied as the reset signal f to the frequency divider 5.

On the other hand, a monostable multivibrator (MM) 9 produces a pulse c having a duration T2 in response to the output pulse of the transition detector 12. The pulse c is applied to an INHIBIT terminal of the phase comparator 2 to inhibit the phase comparison operation of the phase comparator 2 during the duration T2 of the pulse c. Therefore, the phase change information of the reference signal is not transferred to the VCO 4 during the duration T2 of the pulse c.

Referring to FIG. 4, in a stable state of the PLL circuit before a transition of the HSW signal a, the output signal e of the frequency divider 5 ($e_1$, for example) is phase-locked to the reference signal d ($d_1$, for example), and the reset signal f ($f_1$, for example) is synchronized with the signal e. After the transition of the HSW signal a, the phase of the reference signal d is discontinuously delayed as shown by $d_2$, so that a large phase difference is caused between the reference signal $d_2$ and the output signal $e_2$ of the frequency divider 5. If the phase comparator 2 were active, the phase comparator 2 would produce an error signal $g_1$ corresponding to the phase error between $d_2$ and $e_2$. However, since the operation of the phase comparator 2 is inhibited by the pulse c as described above, no error signal is produced by the phase comparator 2.

At this time, since the pulse b is applied to the switch 7, the reference signal $d_2$ becomes the reset signal $f_2$ for resetting the frequency divider 5. As the result, the next pulse $e_3$ of the output signal e of the frequency divider 5 becomes equal to, or locked to, the reference signal $d_3$. Both of the pulses b and c have been ended before the occurrence of the pulse $d_3$ of the reference signal, so that the PLL circuit has started its normal operation with a phase-locked state to the new phase of the reference signal. Thus, the reset signal is again synchronized with the signal e as shown by $f_3$.

FIG. 5 shows the operation of the PLL circuit in FIG. 3 in the case that the phase of the reference signal e is discontinuously advanced. FIG. 5 may be easily understood from the above description. Thus, the description of FIG. 5 is omitted.

As described above, according to the embodiment shown in FIG. 3, when a discontinuous phase change of the reference signal occurs, the operation of the phase comparator is inhibited during a predetermined time so that the discontinuous phase change information is not transferred through the LPF to the VCO. Further, the frequency divider is forcedly reset by the reference signal after the discontinuous phase change so that the output signal of the frequency divider is quickly phase-locked to the reference signal after the discontinuous phase change. Accordingly, the PLL circuit can quickly recover the stable phase-locked state even when a discontinuous phase change of the reference signal is caused.

The embodiment shown in FIG. 3 uses different monostable multivibrators 8, 9 for producing the pulses b, c having different durations from each other. Alternatively, a single monostable multivibrator may be used for producing a pulse having a predetermined duration which is applied to both the phase comparator and the switch. Of course, other various pulse generating circuits may be used instead of multivibrator. For example, the multivibrator may be replaced by a flip-flop circuit which is set by the output pulse of the transition detector 12 and reset by the reset pulse $f_2$ or by a pulse obtained by delaying the reset pulse $f_2$ for a predetermined time shorter than the period of the reference signal.

Figure 6:
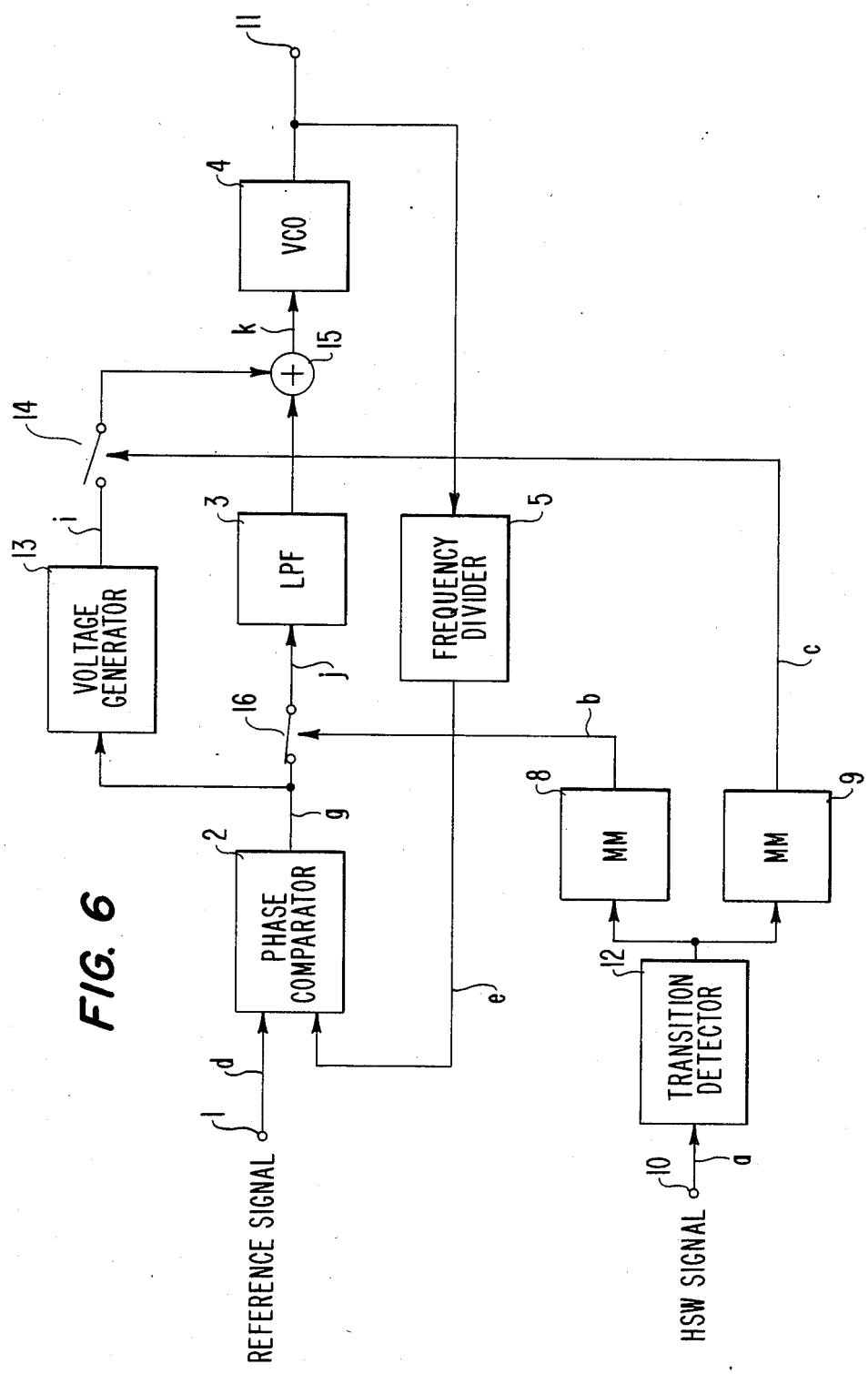
FIG. 6 is a block diagram showing a PLL circuit as another embodiment of the present invention.

FIG. 6 shows another embodiment of PLL circuit according to the invention used in a VTR. The reference signal inputted through the input terminal 1, the HSW signal inputted through the input terminal 10, and the configuration and function of each of the phase comparator 2, LPF 3, VCO 4, frequency divider 5, transition detector 12 and MMs 8, 9 are the same as those of the FIG. 3 embodiment. The structural elements peculiar to the PLL circuit in FIG. 6 are a switch 16 connected between the phase comparator 2 and the LPF 3, an adder 15 connected between the LPF 3 and the VCO 4, and a voltage generator 13 and a switch 14 which are connected between the phase comparator 2 and the adder 15.

The switch 16 is normally closed to pass the output signal of the phase comparator 2 to the LPF 3. The switch 16 is opened in response to the output pulse b of the MM 8 so that the output signal of the phase comparator is not transmitted to the LPF 3 during the duration T1 of the pulse b. The voltage generator 13 generates a voltage signal corresponding to the output signal of the phase comparator 2. The switch 14 is normally opened, but is closed in response to the output pulse c of the MM 9 so as to pass the voltage signal from the voltage generator 13 to the adder 15 during the duration T2 of the pulse c. The adder 15 adds the output signals of the LPF 3 and the switch 14, and applies the added result to the VCO 4.

Figure 7:
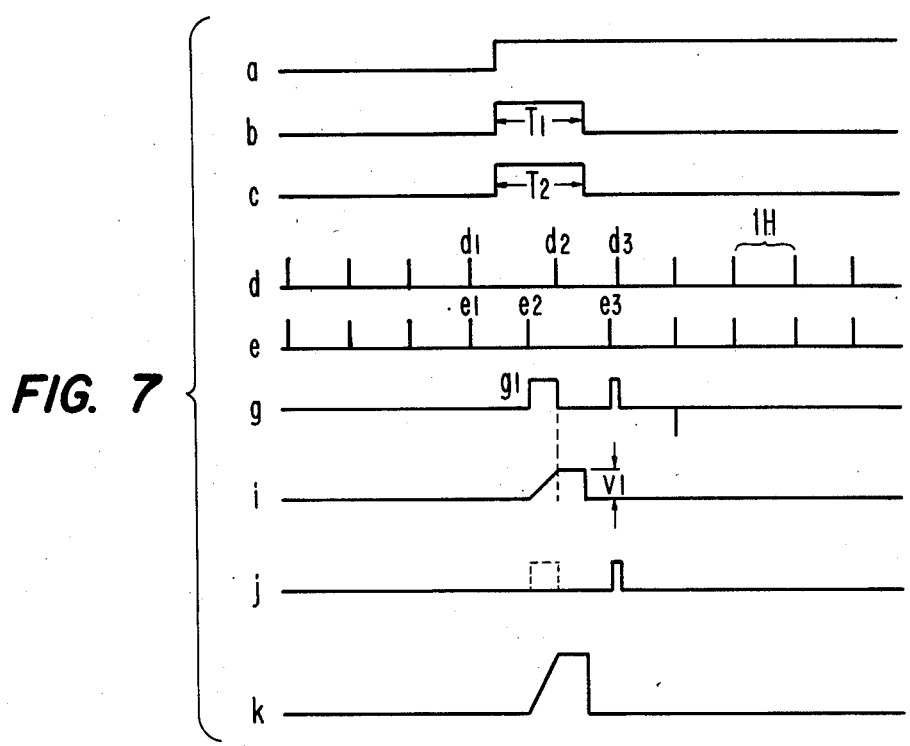
FIG. 7 is a signal waveform chart for explaining the operation of the PLL circuit in FIG. 6.

Referring to FIG. 7 which shows a waveform chart for explaining the operation of the PLL circuit in FIG. 6, a discontinuous phase change is caused between pulses $d_1$ and $d_2$ of the reference signal d. The phase comparator 2 outputs an error signal $g_1$ which is a pulse having a duration corresponding to the phase difference between the reference signal $d_2$ and the output signal $e_2$ of the frequency divider 5. At this time, since the switch 16 is opened in response to the output pulse b of the MM 8, the error signal $g_1$ is not transmitted to the LPF 3 as shown in the broken line pulse waveform in FIG. 7. Thus, the output signal of the LPF 3 does not follow the discontinuous phase change of the reference signal d. In other words, the discontinuous phase change of the reference signal d is not transmitted through the LPF 3 to the VCO 4.

Figure 8:
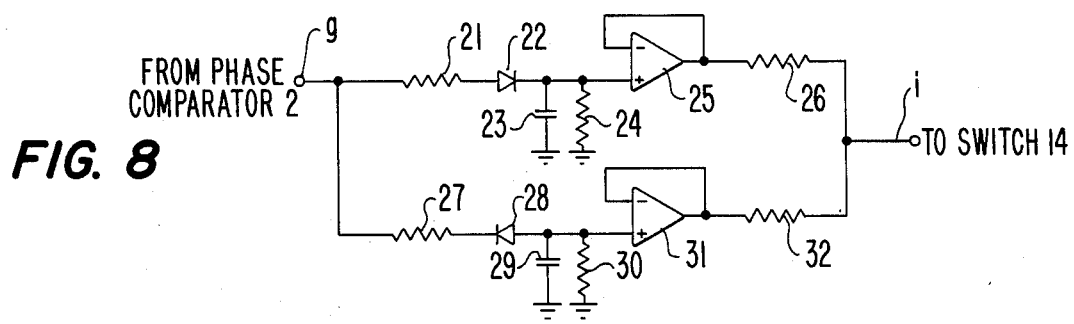
FIG. 8 is an exemplary circuit diagram of a voltage generating circuit used in the PLL circuit in FIG. 6.

The voltage generator 13 generates a voltage signal i having a level $v_1$ corresponding to the pulse width of the error signal $g_1$. An exemplary configuration of the voltage generator 13 is shown in FIG. 8. When the phase comparator 2 produces a positive error pulse signal, a circuit composed of resistors 21, 24, 26, a diode 22, a capacitor 23 and a buffer 25 generates a positive voltage corresponding to the pulse with of the positive error pulse signal. When the phase comparator 2 produces a negative error pulse signal, a circuit composed of resistors 27, 30, 32, a diode 28, a capacitor 29 and a buffer 31 generates a negative voltage corresponding to the pulse width of the negative error pulse signal.

Alternatively, the voltage generator 13 may generate a constant-voltage pulse having a duration corresponding to the pulse width of the error signal produced by the phase comparator 2. The necessary function of the voltage generator 13 is to generate such a voltage signal that the integrated value thereof during the time T1 (which is the duration of the pulse c) in which the switch 14 is closed corresponds to the pulse width of the error signal produced by the phase comparator 2.

The voltage signal i generated by the voltage generator 2 is applied through the switch 14 to the adder 15. Since the output signal of the LPF 3 is kept unchanged, the voltage signal i becomes a change of voltage signal k applied to the VCO 4. In response to the rapid change of the voltage signal k, the VCO 4 rapidly changes (decreases in the case of FIG. 7) its oscillation frequency so that the phase of the output signal e of the frequency divider 5 rapidly becomes close to that of the reference signal. That is, the pulse $e_3$ next to the pulse $e_2$ of the output signal e of the frequency divider 5 becomes close in phase to the pulse $d_3$ next to the pulse $d_2$ of the reference signal. Since the phase difference between the pulse $d_3$ and the pulse $e_3$ is now very small, the PLL circuit can be immediately brought into the phase-locked state by its normal control loop.

As described above, according to the embodiment shown in FIG. 6, when a discontinuous phase change of the reference signal occurs, the switch for normally connecting the phase comparator and the LPF is opened during a predetermined time so that the discontinuous phase change information is not transmitted through the LPF to the VCO. Further, the voltage generator generates rapidly a voltage signal corresponding to the pulse width of the error signal produced by the phase comparator, and the generated voltage signal is applied to the VCO to forcedly change the oscillation frequency of the VCO so that the output signal of the frequency divider is quickly phase-locked to the reference signal after the discontinuous phase change of the reference signal. Accordingly, the PLL circuit can quickly recover the stable phase-locked state even when a discontinuous phase change of the reference signal is caused.

Also in the embodiment shown in FIG. 6, the two MMs 8, 9 may be replaced by a single monostable multivibrator which is responsive to the output pulse of the transition detector 12 for producing a pulse having a predetermined duration which is applied to both the switches 16, 14. Of course, other various pulse generating circuits may be used instead of multivibrator. For example, the multivibrator may be replaced by a flip-flop circuit which is set by the output pulse of the transition detector 12 and reset by a pulse obtained by delaying the pulse $d_2$ of the reference signal for a predetermined time shorter than the period of the reference signal.

Furthermore, the HSW signal is used as the discontinuous plase change informing signal for controlling the PLL circuit in the embodiments shown in FIGS. 3 and 6. But, alternatively, the vertical synchronizing signal contained in the reproduced video signal may be used as the discontinuous plase change informing signal because the transition timing of the HSW is generally adjacent to the vertical synchronizing signal occurrence timing.

In the above description, it is though that the discontinuous phase change of the reference signal would be caused at the switching timing of the pair of rotary heads, and thus each of the PULL circuits shown in FIGS. 3 and 6 uses the HSW signal as the control signal for controlling the PLL circuit to recover the stable state. However, there would be such a case that a discontinuous phase change of the reference signal would be caused by other unexpectable causes. Further, the PLL circuit would be used in other apparatus in which the signal like the HSW signal is not available. These problems can be solved by modifying the PLL circuits shown in FIGS. 3 and 6 to be equipped with a phase change detector which is capable of detecting a discontinuous phase error of the reference signal for producing the control signal for the PLL circuit. Such modified embodiments of the invention will be described hereinbelow.

Figure 10:
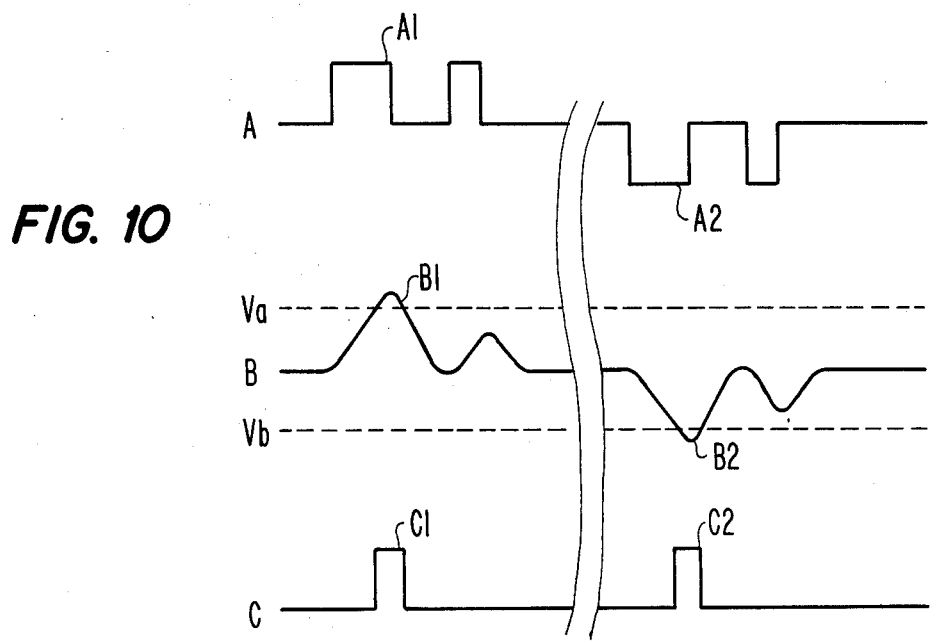
FIG. 10 is a signal waveform chart for explaining the operation of a phase change detector used in the PLL circuit in FIG. 9.
Figure 9:
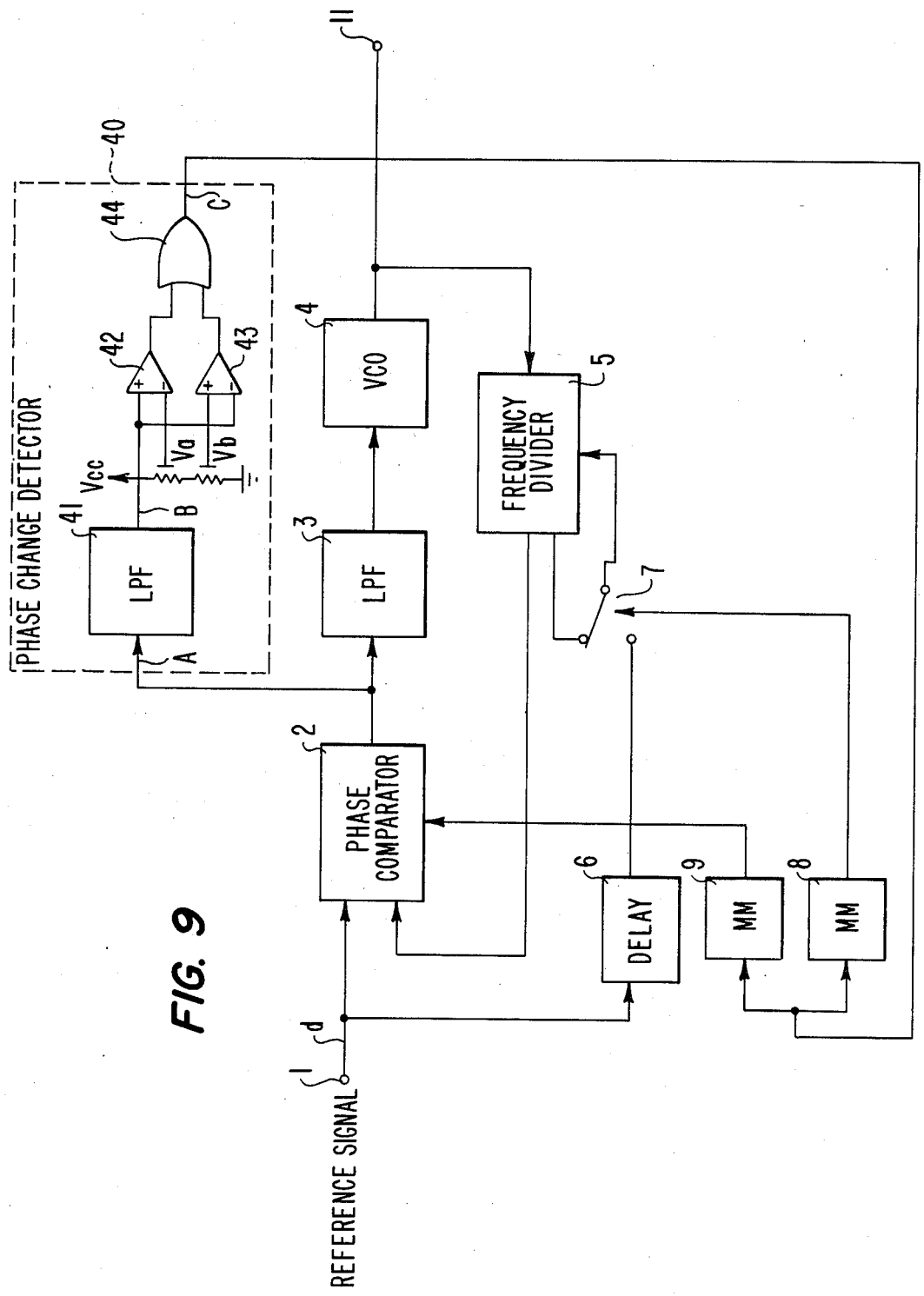
FIG. 9 is a block diagram showing a PLL circuit as still another embodiment of the present invention.

FIG. 9 shows a PLL circuit which is obtained by modifying the FIG. 3 embodiment such that the input terminal 9 and the transition detector 12 are removed and a phase change detector 40 is connected between the phase comparator 2 and the MMs 8, 9. FIG. 10 shows a waveform chart for explaining the operation of the phase change detector 40. The phase change detector 40 is responsive to a large phase change of the reference signal d for producing a pulse which triggers the MMs 8, 9. In other words, when the output pulse of the phase comparator 2 has a wider pulse width than a predetermined pulse width, the phase change detector 40 outputs the pulse for triggering the MMs 8, 9 so that the PLL circuit recovers its stable state in the manner as described above in connection with the embodiment shown in FIG. 3.

The signal A inputted to a low-pass filter (LPF) 41 is the output signal of the phase comparator 2. When the phase comparator 2 outputs a positive pulse A1 having a wider pulse width than the predetermined pulse width, the output signal B of the LPF 41 becomes higher than an upper threshold level Va as shown by B1. Thus, a level comparator 42 produces a pulse C1 for triggering the MMs 8, 9. When the phase comparator 2 outputs a negative pulse A2 having a wider pulse width than the predetermined pulse width, the output signal B of the LPF 41 becomes lower than a lower threshold level Vb as shown by B2. Thus, a level comparator 43 produces a pulse C2 for triggering the MMs 8, 9. The pulse produced by the level comparator 42 or 43 is applied through an OR gate 44, as the pulse signal C, to the MMs 8, 9.

Figure 11:
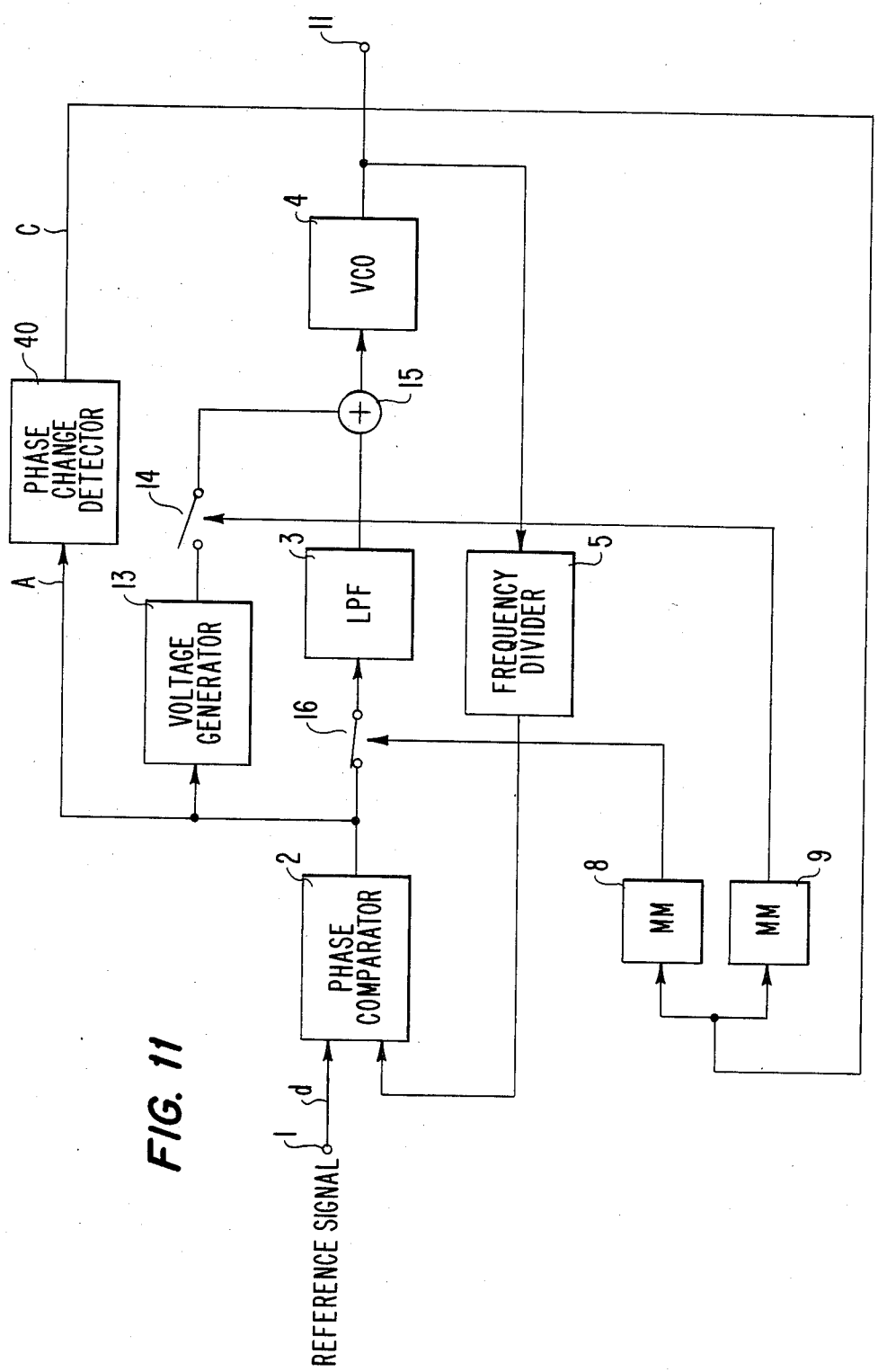
FIG. 11 is a block diagram showing a PLL circuit as a yet another embodiment of the present invention.

The same modification can be applied to the FIG. 6 embodiment as shown in FIG. 11. The phase change detector 40 in FIG. 11 has the same configuration as that shown in FIG. 9, and is responsive to a large phase change of the reference signal for producing a pulse which triggers the MMs 8, 9 so that the PLL circuit recovers its stable state in the manner as described in connection with the FIG. 6 embodiment.

What is claimed is:

1. A phase locked loop circuit comprising:
   a voltage-controlled oscillator oscillating at a frequency corresponding to a voltage applied thereto;
   a frequency divider for dividing the oscillation frequency of the voltage-controlled oscillator;
   a phase comparator for comparing phases of a reference signal inputted to the PLL circuit and an output signal of the frequency divider;
   a low-pass filter for converting a phase comparison result of the phase comparator to a voltage for controlling the voltage-controlled oscillator;
   first control means responsive to a discontinuous phase change of the reference signal for preventing a phase change of the reference signal from being transmitted through the low-pass filter to the voltage-controlled oscillator during a predetermined period; and
   second control means responsive to the discontinuous phase change of the reference signal for forcedly pulling-in the phase of the PLL circuit so that the phase of the output signal of the frequency divider is locked to a new phase of the reference signal after the discontinuous phase change during a predetermined period.

2. A phase locked loop circuit according to claim 1, wherein the first control means comprises a first pulse generator responsive to the discontinuous phase change of the reference signal for generating a first pulse having a predetermined duration for inhibiting the operation of the phase comparator during the predetermined duration of the first pulse, and
   wherein the second control means comprises: a second pulse generator responsive to the discontinuous phase change of the reference signal for generating a second pulse having a predetermined duration; and a switch responsive to the second pulse for applying a pulse of the reference signal after the discontinuous phase change to the frequency divider during the predetermined duration of the second pulse to reset the frequency divider, thereby forcedly locking the phase of the output signal of the frequency divider to the new phase of the reference signal.

3. A phase locked loop circuit according to claim 1, wherein the first control means comprises a first pulse generator responsive to the discontinuous phase change of the reference signal for generating a first pulse having a predetermined duration, and a first switch responsive to the first pulse for disconnecting the low-pass filter from the phase comparator during the predetermined duration of the first pulse, and
   wherein the second control means comprises: a second pulse generator responsive to the discontinuous phase change of the reference signal for generating a second pulse having a predetermined duration; a voltage generator for generating a voltage signal corresponding to the discontinuous phase change of the reference signal; a second switch responsive to the second pulse for passing the voltage signal generated by the voltage generator during the predetermined duration of the second pulse; and a voltage adder for adding output voltages from the low-pass filter and the second switch and applying an added voltage to the voltage-controlled oscillator to forcedly change the oscillation frequency so that the phase of the output signal of the frequency divider becomes locked to the new phase of the reference signal.

* * * * *